United States Patent
Guo et al.

(10) Patent No.: US 6,605,531 B1
(45) Date of Patent: Aug. 12, 2003

(54) HOLE-FILLING TECHNIQUE USING CVD ALUMINUM AND PVD ALUMINUM INTEGRATION

(75) Inventors: Ted Guo, Palo Alto, CA (US); Wei Shi, San Jose, CA (US); Liang-Yuh Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/127,010

(22) Filed: Jul. 31, 1998

Related U.S. Application Data
(60) Provisional application No. 60/066,622, filed on Nov. 23, 1997.

(51) Int. Cl.$^7$ .......................................... H01L 21/4763
(52) U.S. Cl. .................... 438/637; 438/618; 438/622; 438/624; 438/652; 438/663; 438/660
(58) Field of Search ................. 438/618, 622, 438/624, 637, 652, 660, 663, 680, 688; 257/751

(56) References Cited

U.S. PATENT DOCUMENTS

| | | | |
|---|---|---|---|
| 4,784,973 A | 11/1988 | Stevens et al. | 437/200 |
| 4,920,073 A | 4/1990 | Wei et al. | 437/200 |
| 4,926,237 A | 5/1990 | Sun et al. | 357/71 |
| 4,951,601 A | 8/1990 | Maydan et al. | 118/719 |
| 4,960,732 A | 10/1990 | Dixit et al. | 437/192 |
| 4,994,410 A | 2/1991 | Sun et al. | 437/192 |

(List continued on next page.)

FOREIGN PATENT DOCUMENTS

| | | | |
|---|---|---|---|
| DE | 3743591 A1 | 7/1988 | |
| EP | 0 351 001 A1 | 7/1989 | |
| EP | 0 448 763 A1 | 3/1990 | |
| EP | 92 30 0687 | 5/1992 | |
| EP | 0498550 A1 | 8/1992 | |
| EP | 0 506 129 A1 | 9/1992 | ......... H01L/21/285 |
| EP | 98 30 0539 | 1/1998 | |
| EP | 98 30 0539 | 7/1998 | |
| JP | 8-10693 | 1/1986 | |
| JP | H2-026051 | 1/1990 | |
| JP | 03289156 | 12/1991 | |
| JP | 07176612 | 7/1995 | |
| JP | 2513900 | 7/1996 | |
| JP | 08293552 | 11/1996 | ......... H01L/21/768 |
| JP | 08 293552 A | 11/1996 | ......... H01L/21/768 |

OTHER PUBLICATIONS

Weast et al. "CRC Handbook of Chemistry and Physics", pp. B–7, B–14, and B–39, Aug. 1989.*

(List continued on next page.)

*Primary Examiner*—Amir Zarabian
*Assistant Examiner*—Maria Guerrero
(74) *Attorney, Agent, or Firm*—Moser, Patterson & Sheridan LLP

(57) ABSTRACT

The present invention provides a method for filling an aperture on a substrate by depositing a metal film on the substrate of insufficient thickness to fill the sub half-micron aperture and then annealing the substrate in a low pressure chamber at a temperature below a melting point of the deposited metal film. The present invention further provides forming a planarized film over the void-free aperture by physical vapor depositing a metal film over the annealed film.

28 Claims, 3 Drawing Sheets

---

A FIRST METAL IS DEPOSITED ONTO A SUBSTRATE HAVING APERTURES OR OTHER FEATURES FORMED THEREON

↓

THE SUBSTRATE IS ANNEALED IN A LOW PRESSURE CHAMBER AT A TEMPERATURE BELOW THE MELTING POINT TEMPERATURE OF THE DEPOSITED METAL TO REMOVE THE VOIDS

↓

AN OPTIONAL PVD LAYER IS DEPOSITED ON THE FIRST METAL FILM TO PROVIDE A PLANARIZED FILM

U.S. PATENT DOCUMENTS

| | | | |
|---|---|---|---|
| 5,010,032 A | 4/1991 | Tang et al. | 437/57 |
| 5,023,201 A | 6/1991 | Stanasolovich et al. | 437/192 |
| 5,028,565 A | 7/1991 | Chang et al. | 437/192 |
| 5,043,299 A | 8/1991 | Chang et al. | 437/192 |
| 5,043,300 A | 8/1991 | Nulman | 437/200 |
| 5,102,826 A | 4/1992 | Ohshima et al. | 437/200 |
| 5,102,827 A | 4/1992 | Chen et al. | 437/200 |
| 5,106,781 A | 4/1992 | Penning De Vries | 437/472 |
| 5,143,867 A | 9/1992 | d'Heurle et al. | |
| 5,147,819 A | 9/1992 | Yu et al. | 437/173 |
| 5,250,465 A | 10/1993 | Iizuka et al. | 437/173 |
| 5,250,467 A | 10/1993 | Somekh et al. | 437/192 |
| 5,318,923 A | 6/1994 | Park | 437/188 |
| 5,355,020 A * | 10/1994 | Lee et al. | 257/741 |
| 5,380,682 A | 1/1995 | Edwards et al. | |
| 5,478,780 A | 12/1995 | Koerner et al. | 437/190 |
| 5,514,425 A | 5/1996 | Ito et al. | 427/534 |
| 5,567,987 A * | 10/1996 | Lee | 257/751 |
| 5,572,072 A | 11/1996 | Lee | 257/751 |
| 5,607,776 A | 3/1997 | Mueller et al. | 428/472 |
| 5,662,788 A | 9/1997 | Sandhu et al. | 205/87 |
| 5,843,842 A * | 12/1998 | Lee et al. | 438/688 |
| 5,877,087 A * | 3/1999 | Mosely et al. | 438/656 |
| 6,080,655 A * | 6/2000 | Givens et al. | 438/626 |
| 6,169,030 B1 * | 1/2001 | Naik et al. | 438/680 |

OTHER PUBLICATIONS

Ghandhi "VLSI Fabrication Principles, Silicon and Gallium Arsenide", 1983, pp. 325–328.*

Tohru Hara, Kouichi Tani, and Ken Inoue, "Formation of titanium nitride layers by the nitridation of titanium in high–pressure ammonium ambient," received Apr. 18, 1990; accepted for publication Jul. 27, 1990, pp. 1660–1662.

W. Y–C. Lai, K.P. Cheung, D.P. Favreau, C. Case, R. Liu, and R.G. Murray, "CVD Aluminum for Submicron VLSI Metallization," Jun. 11–12, 1991 VMIC Conference, pp. 89–95.

K. Sugai, H. Okabayashi, T. Shinzawa, S. Kishida, A. Kobayashi, T. Yako and H. Kadorkura, "Aluminum chemical vapor deposition with new gas phase pretreatment using tetrakisdimethylamino–titanium for ultralarge–scale integrated–circuit metallization," Received Oct. 31, 1994; accepted Jun. 16, 1995, 4 pages.

K. Tsukamto, T. Okamoto, M. Shimizu, T. Jatsukawa, and H. Harada, "Self–Aligned Titanium Silicidation by Lamp Annealing," Mizuhara, Itami, 664 Japan, pp. 47–50.

IBM Technical Disclosure Bulletin, vol. 37, No. 10, Oct. 1994, p. 61–.

Nobuyoshi Awaya, Hiroshi Inokawa, Eiichi Yamamoto, Yudio Okazaki, Masayasu Miyake, Yoshinobu Arita, and Toshio Koyayashi, "Evaluation of a Copper Metallization Process and the Eelectrical Characteristics of Copper–Interconnected Quarter–Micron CMOS, "vol. 43, No. 8, Aug. 1996, pp. 1206–1211.

PCT International Search Report dated Mar. 4, 1999.

C. Marcadal, et al., "CVD Process for Copper Interconnection," Microelectronic Engineering, vol. 37–38, Nov. 1997, pp. 97–103.

G. A. Dixit, et al., "A Novel 0.25 $\mu$m Via Plug Process Using Low Temperature CVD Al/TiN," Technical Digest of the International Electron Devices Meeting, Washington, Dec. 10–13, 1995, Dec. 10, 1995, pp. 1001–1003.

* cited by examiner

HOLE-FILLING TECHNIQUE USING CVD ALUMINUM AND PVD ALUMINUM INTEGRATION

This application claims the benefit of provisional application No. 60/066,622 filed Nov. 23, 1997.

BACKGROUND OF THE INVENTION

1. Field of the Invention

The present invention relates generally to a metallization process for manufacturing semiconductor devices. More particularly, the present invention relates to the metallization of apertures to form void-free interconnects between conducting layers, including contacts and vias in high aspect ratio, sub-half micron applications.

2. Background of the Related Art

Sub-half micron multilevel metallization is one of the key technologies for the next generation of very large scale integration ("VLSI"). The multilevel interconnects that lie at the heart of this technology require planarization of high aspect ratio apertures, including contacts, vias, lines or other features having aperture widths less than 0.25 $\mu$m and aperture depths greater than the aperture widths. Reliable formation of these interconnects is very important to the success of VLSI and to the continued effort to increase circuit density and quality on individual substrates and die.

Metal interconnects are typically formed by physical vapor deposition (PVD), chemical vapor deposition (CVD), and sequential combinations thereof. Generally, PVD metal films provide superior reflectivity because of better crystalline growth and orientation of the deposited atoms. However, because PVD generally requires atom sputtering from a target in a particular direction, it is difficult to achieve conformal layers on semiconductor features, i.e., a uniform thickness layer on the sides and base of the features. On the other hand, CVD metal films provide excellent conformal coverage of features but poor crystalline orientation and thus low reflectivity.

Aluminum (Al) layers formed by chemical vapor deposition ("CVD"), like other CVD processes, provide good conformal aluminum layers for very small geometries, including sub-half micron (<0.5 $\mu$m) apertures, at low temperatures. Therefore, CVD of aluminum is a common method used to fill apertures. However, recent transmission electron microscopy data ("TEM") has revealed that voids exist in many of the apertures deposited with CVD Al even though electric tests of these same apertures do not evidence the existence of this void.

FIG. 1 is a partial cross sectional view of a substrate 10 having a via structure 14 formed thereon. A dielectric layer 12 on the surface of the substrate 10, typically etched in a desired pattern, is shown including a via 14 having a high aspect ratio, i.e., a high ratio of via depth to via diameter, typically at least about three (3). A CVD Al film 16 is shown deposited on the substrate and into the via, and a void 18 is formed in the via. It should be recognized that this kind of void is very difficult to detect by regular cross sectional standard electron microscopy ("SEM") techniques, because some deformation occurs in soft aluminum during mechanical polishing. In addition, electric conductivity tests do not detect any structural abnormalities. However, despite the generally positive electric conductivity tests, conduction through the feature having the void may, over time, compromise the integrity of the device.

FIG. 3 is a partial cross sectional view of a substrate 10 having a via structure 20 formed thereon. A dielectric layer on the surface of the substrate 10, typically etched in a desired pattern, is shown including a via 20 having a sub-half micron diameter. A CVD Al film 16 is shown deposited on the substrate and into the via without bridging the via.

A TEM study of various CVD Al layers formed on substrates indicates that the formation of voids occurs through a key hole process wherein the top portion of the via becomes sealed before the via has been entirely filled. Although a thin conformal layer of CVD Al can typically be deposited in high aspect ratio contacts and vias at low temperatures to line the walls and the bottom of the features as shown in FIG. 3, continued CVD deposition to completely fill the contacts or vias typically results in the formation of voids therein as shown in FIG. 1. Extensive efforts have been focused on elimination of voids in metal layers by modifying CVD processing conditions. However, the results have not yielded a satisfactory method of manufacturing void free structures.

An alternative technique for metallization of high aspect ratio apertures is hot planarization of aluminum through physical vapor deposition ("PVD"). The first step in this process requires deposition of a thin layer of a refractory metal such as titanium (Ti) on a patterned wafer to form a wetting layer which facilitates flow of the Al during the PVD process. Following deposition of the wetting layer, the next step requires deposition of either (1) a hot PVD Al layer, or (2) a cold PVD Al layer followed by a hot PVD Al layer onto the wetting layer. However, hot PVD Al processes are very sensitive to the quality of the wetting layer, substrate condition, and other processing parameters. Small variations in processing conditions and/or poor coverage of the wetting layer can result in incomplete filling of the contacts or vias, thus creating voids. In order to reliably fill the vias and contacts, hot PVD Al processes must be performed at temperatures above about 450° C. Because the PVD wetting process provides poor coverage of high aspect ratio, sub-micron via sidewalls, hot PVD Al does not provide reliable filling of the contacts or vias. Even at higher temperatures, PVD processes may result in a bridging effect whereby the opening of the contact or via is closed because the deposition layer formed on the top surface of the substrate and the upper walls of the contact or via join before the floor of the contact or via has been completely filled.

One attempt at filling high aspect ratio sub-half micron contacts and vias, disclosed in U.S. application Ser. No. 08/561,605, uses a thin bonding layer deposited first over the surface of the contacts or vias, followed by a CVD layer, and then a PVD layer. The thin bonding layer is preferably a metal having a relatively higher melting point temperature than the subsequent CVD and PVD metals. However, the problem of the via or contact opening being bridged by the CVD and PVD processes still remains, and voids may still form in the contacts or vias.

Therefore, there remains a need for a low temperature metallization process for filling apertures, particularly high aspect ratio, sub-half micron contacts and vias. More particularly, it would be desirable to have a low temperature process for filling such contacts and vias with a low temperature CVD Al process and allowing the feature to be planarized with PVD Al to achieve high reflectivity. Furthermore, there is a need to expand the applications for low temperature CVD Al wherein voids formed by the CVD process can be removed regardless of the size of the features. It would be further desirable to have such process incorporating high power PVD to further reduce process time and improve throughput.

SUMMARY OF THE INVENTION

The present invention generally provides a low temperature metallization process for filling apertures, particularly high aspect ratio, sub-half micron contacts and vias. More particularly, the present invention provides a low temperature process for filling such contacts and vias with a low temperature CVD Al process and allowing the feature to be planarized with PVD Al to achieve high reflectivity.

One aspect of the invention provides a method for filling an aperture on a substrate by chemical vapor depositing a metal film on a substrate to a sufficient thickness so that there is a continuous film in the aperture which may cause bridging of the aperture and then, annealing the substrate in a low pressure chamber at a temperature below the melting point of the deposited metal film. The invention further provides forming a planarized film over the void-free aperture by physical vapor depositing a metal film over the annealed CVD film.

Another aspect of the invention expands the applications for low temperature CVD Al wherein voids formed by the CVD process can be removed regardless of the size of the features. The present invention further incorporates high power PVD to deposit a high quality film while further reducing process time and improving throughput.

Yet another aspect of the present invention provides an apparatus for filling an aperture and forming a film over a substrate including a chemical vapor deposition (CVD) chamber for depositing a first film on the substrate, a high vacuum annealing chamber for annealing the substrate and eliminating any voids formed in the first film deposited in the aperture, a physical vapor deposition (PVD) chamber for depositing a planarized film over the first film, and a transfer chamber connected to the CVD chamber, the annealing chamber, and the PVD chamber. The annealing chamber may be a CVD, a PVD chamber or a separate annealing chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
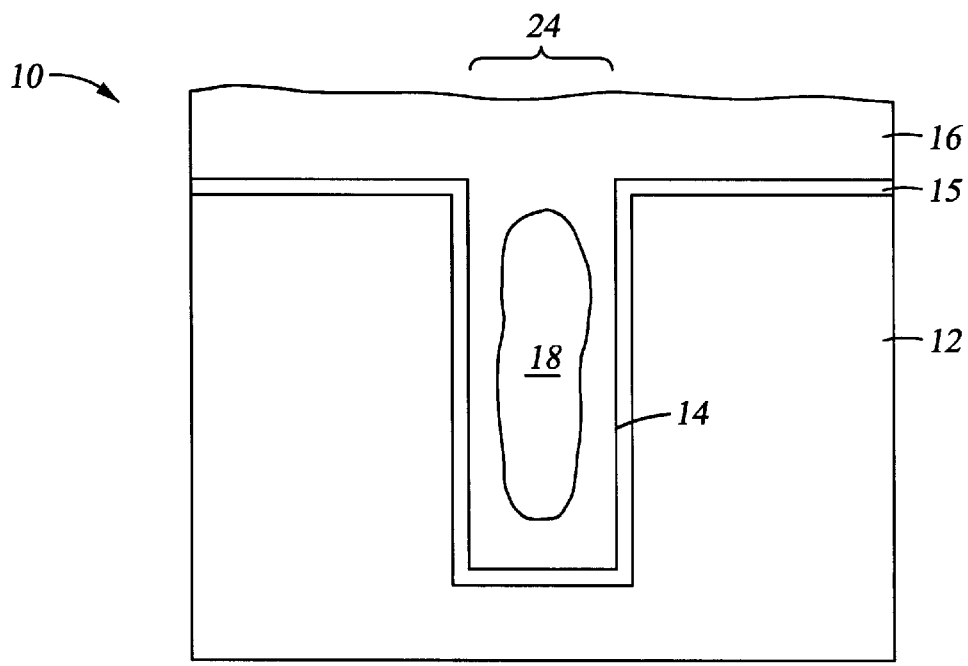
FIG. 1 is a partial cross sectional view of a substrate having a via structure formed thereon and a deposited CVD Al film that bridges the high aspect ratio aperture.
Figure 2:
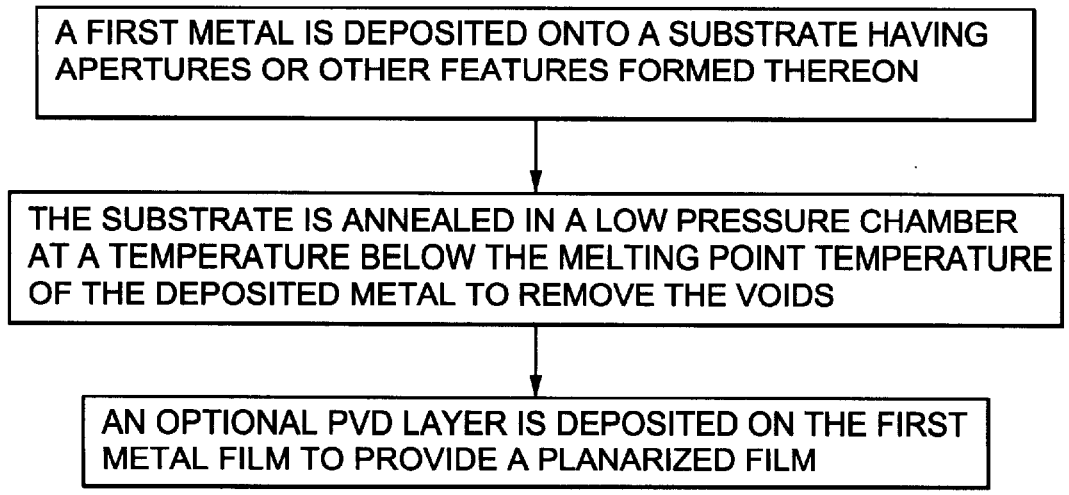
FIG. 2 is a flow diagram illustrating the steps of the invention.

FIG. 2 is a flow diagram illustrating the steps of the invention. First, a substrate having one or more contacts, vias or other features formed thereon has a first metal film deposited thereon. Typically, the metal deposition can easily bridge the aperture openings and form voids therein as shown on FIG. 1, especially for sub 0.25 μm feature. Second, the substrate is annealed in a low pressure chamber at a temperature below the melting point temperature of the deposited metal to remove the voids. Third, an optional PVD layer is deposited on the annealed first metal layer to provide a planarized film at a high deposition rate and to provide a highly reflective film.

According to the invention, a substrate having a via or contact formed thereon is transferred into a metal deposition chamber, and a layer of aluminum is first deposited in the contact or via and over the substrate surface. The preferred deposition process is CVD Al. However, CVD of copper (Cu) or other metals or electrochemical deposition of aluminum or copper are also contemplated by the invention. While the CVD Al may be deposited under various conditions, a standard low temperature CVD process involves wafer temperatures of between about 180° C. and about 265° C. and a deposition rate of between about 20 Å/sec and about 130 Å/sec. The CVD Al deposition may be performed at chamber pressures of between about 1 Torr and about 80 Torr, with the preferred chamber pressure being about 25 Torr. The preferred deposition reaction for CVD Al involves the reaction of dimethyl aluminum hydride ("DMAH") according to the following equation:

$$(CH_3)_2Al-H+H_2 \rightarrow Al+H_2+(Hydrocarbon)$$

The CVD Al deposition is continued until the via or contact opening is bridged because of the crowning effects that generally result from deposition within small apertures. Typically, the via opening pinches to form a bridging portion 24 and creates a void 18 inside the via 14 as shown in FIG. 1. The CVD Al deposition is continued until about 200 Å to about 1000 Å has been deposited on the substrate. Preferably, the thickness of the film at the bridging portion is about 800 Å. A CVD Al film thicker than about 1000 Å may be deposited since the present invention overcomes bridging of the aperture After the CVD Al deposition, the substrate is preferably transferred without breaking vacuum from the CVD chamber into an annealing chamber. Alternatively, the annealing chamber, instead of being a separate chamber, can be a CVD chamber or a PVD chamber so long as the chamber can provide the required temperature and pressure to remove the voids. The substrate is annealed in the annealing chamber to remove the voids formed in the apertures during the CVD process. The annealing step is preferably carried out in a high vacuum (low pressure) chamber at a substrate temperature between about 300° C. and 500° C. and a pressure typically at or below 1 torr, preferably as low as 5 mTorr. The annealing step is typically performed from about 10 seconds to about 2 minutes or higher. The annealing step allows the removal of any voids and filling of the aperture because the Al atoms become highly mobile at the elevated temperature and because the pressure difference between the voids having trapped gas therein and the low pressure anneal chamber forces the trapped gas to escape through the CVD Al film bridging portion.

Figure 3:
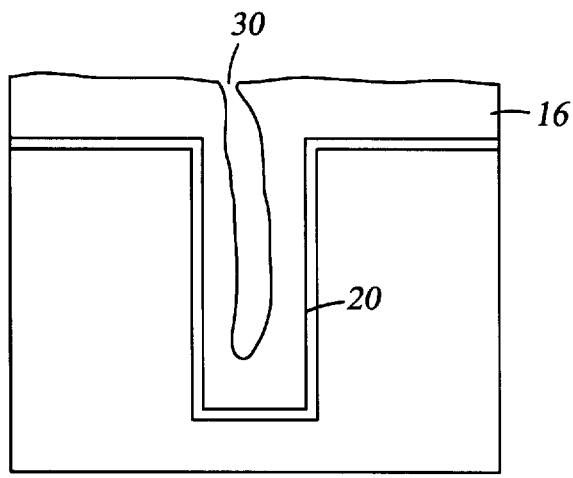
FIG. 3 is a partial cross sectional view of a substrate having a via structure formed thereon and a CVD Al film that does not bridge the sub-half micron aperture or a cross sectional view of the aperture of FIG. 1 during the annealing step showing a break in the bridging portion of the CVD Al film.
Figure 4:
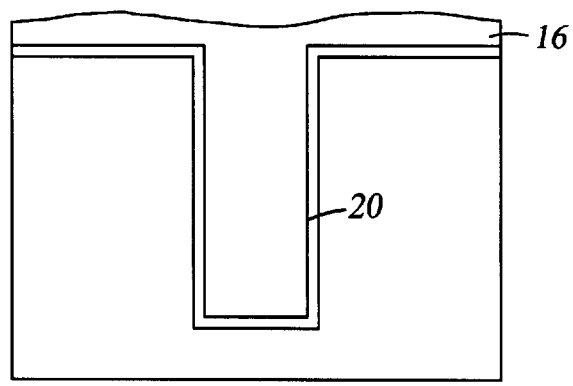
FIG. 4 is a cross sectional view of the aperture after the annealing step showing a void free aperture completely filled with the annealed CVD Al.

FIG. 3 is a cross sectional view of an aperture 20 during the annealing step showing an escape passage 30 in the bridging portion 24 of the CVD Al film 16. As the trapped gas escapes from the void 18, the deposited CVD Al 16 flows into the void and completely fills the aperture 20. FIG. 4 is a cross sectional view of an aperture 20 after the annealing step showing a void free aperture completely filled with the annealed CVD Al.

Although, the present invention provides for removal of voids 18 that form in apertures during metal deposition, it is important that the bridging portion 24 does not become too thick so as to require the annealing step to be conducted at or near the melting temperature of the metal. For example, in experiments conducted, a CVD Al film thickness of about 2400 Å over an aperture having a void therein was too thick to allow removal of the void by the annealing step in a low pressure annealing chamber having a pressure therein of about 5 mTorr. However, because the maximum thickness of the bridging portion through which gases can be released is related to the pressure, temperature and other annealing chamber conditions, the thickness of the bridging portion can vary according to the conditions of the annealing step.

Another factor relating to the maximum thickness of the bridging portion is the gas pressure build-up in the voids. Typically, gas by-products from the CVD reaction are trapped in the voids at relatively high pressures between about 10 Torr and about 30 Torr. Because the annealing step is carried out in a high vacuum (low pressure) chamber, a higher pressure build-up in the voids can overcome a thicker bridging portion.

Figure 5:
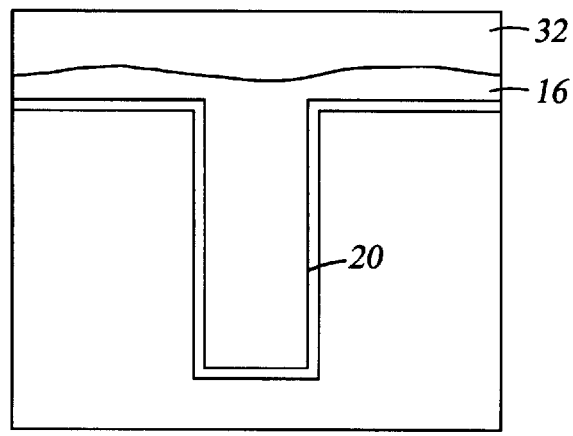
FIG. 5 is a partial cross sectional view of a substrate deposited with a PVD Al layer after annealing the CVD Al layer.

After the annealing step, a PVD Al layer is deposited on the substrate at a substrate temperature below about 660° C., preferably below about 400° C. FIG. 5 is a partial cross sectional view of a substrate 10 having a PVD Al layer 32 deposited thereon following the annealing process performed on the CVD Al layer 16. The PVD Al is preferably deposited at a high power (typically above about 2 kW and preferably above about 6 kW) to improve reflectivity of the resulting film stack and to provide a higher deposition rate compared to the CVD Al process. High reflectivity is desirable for various reasons including formation of a better crystalline structure and orientation of the metal atoms as well as for better resolution for subsequent photolithography processes.

The PVD Al may contain certain dopants, such as copper (Cu), and upon deposition, the PVD Al may intermix with the CVD Al so that the dopant is dispersed throughout much of the PVD/CVD Al intermixed layer.

Figure 6:
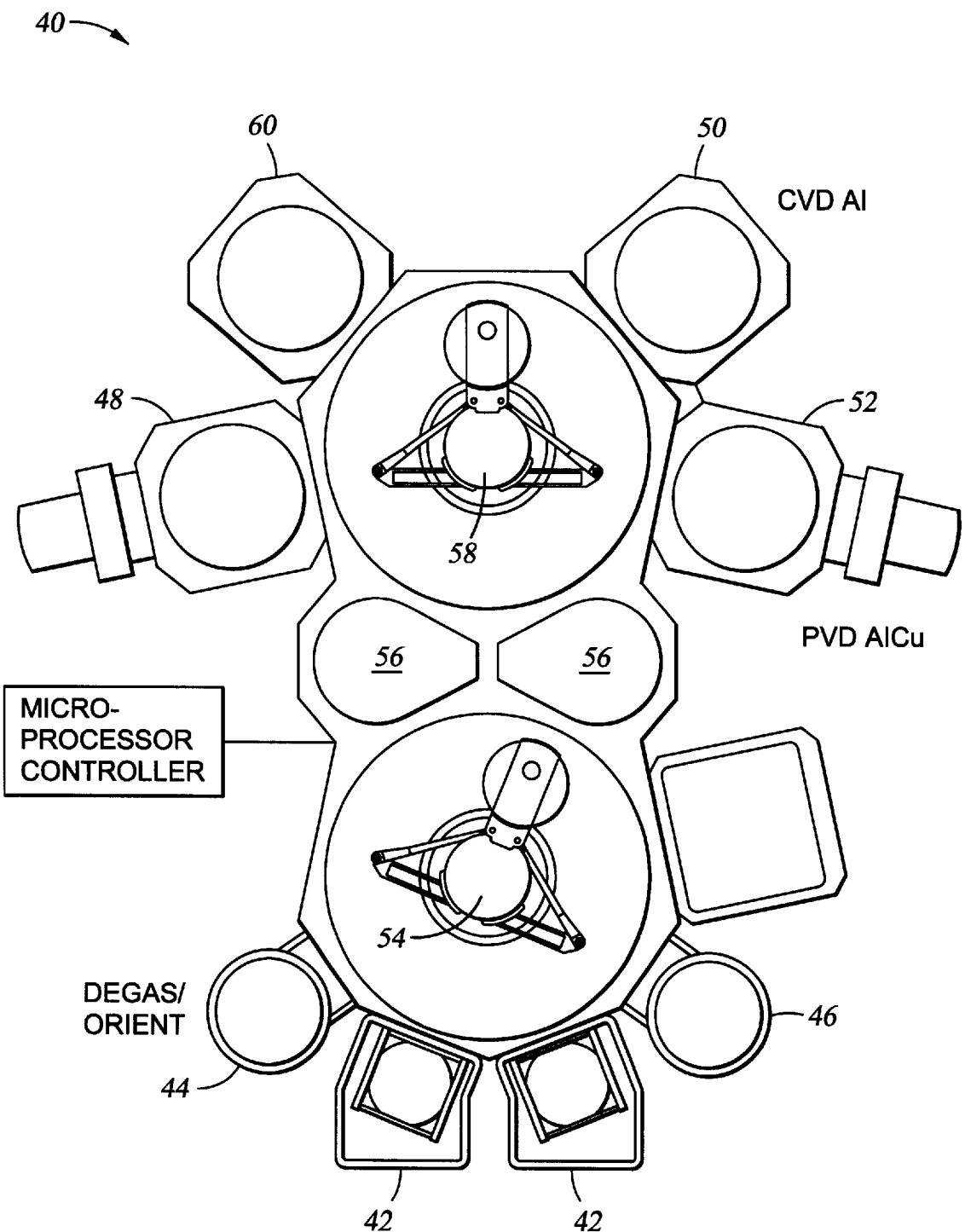
FIG. 6 is a schematic diagram of an integrated cluster tool typically used in processing semiconductor substrates.

FIG. 6 is a schematic diagram of an integrated cluster tool 40 typically used in processing semiconductor substrates. One staged-vacuum substrate processing system is disclosed in U.S. Pat. No. 5,186,718, entitled "Staged-Vacuum Wafer Processing System and Method," Tepman et al., issued on Feb. 16, 1993, which is hereby incorporated herein by reference. A microprocessor controller is provided to control the sequence and formation of the desired film layers on the substrates. The cluster tool generally includes a loadlock chamber 42, a de-gas/orientation chamber 44, a pre-clean chamber 46, an etching chamber 48, a CVD chamber 50, a PVD chamber 52, an anneal chamber 60 and other processing chambers depending on the particular application.

FIG. 3 is a cross sectional view of an aperture 20 during the annealing step showing an opening 30 in the CVD Al film 16. The deposited CVD Al 16 flows into the aperture 20. FIG. 4 is a cross sectional view of an aperture 20 after the annealing step showing a void free aperture substantially filled with the annealed CVD Al 16. FIG. 5 is a partial cross sectional view of a substrate having a PVD Al layer 32 deposited thereon following the annealing process performed on the CVD Al layer 16.

According to the present invention, a substrate is loaded into the processing system through the loadlock chamber and transferred by a first robot 54 into an intermediate staging chamber 56 after degas and orientation of the substrate. The substrate is then transferred by a second robot 58 into a metal deposition chamber to form a conductive nucleation layer 15, 75 (FIG. 1) and then into a CVD Al chamber where a CVD Al film is deposited onto the substrate. The conductor nucleation layer 15 may comprise titanium (ti), titanium nitride (TiN), tantalum (Ta), and tantalum nitride (TaN) as the CVD Al film is grown in the apertures, voids form as the crowning effect of the deposition process bridges the openings of the apertures. The substrate is then transferred to an anneal chamber 60 wherein the substrate is annealed to remove the voids. After annealing, the substrate is transferred to a PVD chamber for deposition of a planarized PVD Al or PVD AlCu layer. Then the substrate is transferred to other processing chambers for further processing or out of the processing system through the loadlock chambers.

The annealing step of the present invention can be implemented in a separate annealing chamber as described above or in either a separate anneal chamber or the PVD Al chamber as long as they are equipped to provide the required vacuum and temperature conditions. However, the annealing step should be done after the CVD Al deposition and without breaking vacuum. The PVD film can be deposited in the same processing system in situ or in a separate processing system ex-situ. An integrated system allows the substrate to be processed continually in a single processing tool and provides an improved dispersion throughout the Al layer where a dopant such as Cu is used. At the same time, an integrated system prevents exposure of the processed substrate to the outside environment which may result in the formation of oxide layers on the first deposited layer, i.e., the CVD Al layer. Consequently, formation of an oxide layer onto the CVD Al layer inhibits even distribution of the Cu optionally provided in the PVD Al process throughout the entire Al layer. Alternatively, if the PVD Al is deposited ex-situ, a $H_2$ plasma treatment of the air-exposed CVD Al film can be used to reduce the oxide layer formed on the CVD Al to improve interface between the CVD Al layer and the PVD Al layer.

While the foregoing is directed to the preferred embodiment of the present invention, other and further embodiments of the invention may be devised without departing from the basic scope thereof. The scope of the invention is determined by the claims which follow.

What is claimed is:

1. A method for filling a sub-half micron aperture on a substrate, comprising:
    a) depositing a metal film on the substrate of insufficient thickness to fill the sub half-micron aperture at a pressure of between about 1 Torr and about 80 Torr; and
    b) annealing the substrate in a low pressure chamber at a pressure of not more than 1 Torr at a temperature below a melting point of the deposited metal film.

2. The method of claim 1, wherein the metal film is deposited by chemical vapor deposition.

3. The method of claim 1, wherein the metal film is deposited to a thickness between about 200 Å and about 2000 Å.

4. The method of claim 1, wherein the metal film is deposited to a thickness of about 800 Å.

5. The method of claim 1, wherein the substrate is annealed at a temperature between about 300° C. and about 500° C.

6. The method of claim 1, wherein the substrate is annealed at a pressure less than 5 mTorr.

7. The method of claim 1, wherein the metal film comprises a metal selected from the group of aluminum, copper, and combinations thereof.

8. A method for filling an aperture on a substrate, comprising:
   a) depositing a metal film on the substrate to a sufficient thickness to bridge the aperture; and
   b) annealing the substrate in a low pressure chamber at a pressure less than 5 mTorr and at a temperature below a melting point of the metal film.

9. The method of claim 8, wherein the metal film is copper, aluminum, or combinations thereof, and is deposited by chemical vapor deposition.

10. The method of claim 8, wherein the metal film is deposited to a thickness between about 200 Å and about 2000 Å.

11. The method of claim 8, wherein the metal film is deposited to a thickness of about 800 Å.

12. The method of claim 8, wherein the substrate is annealed at a temperature between about 300° C. and about 500° C.

13. The method of claim 9, further comprising:
   c) physical vapor depositing a planarizing film over the metal film after the annealing of the substrate.

14. A method for filling an aperture on a substrate, comprising:
   a) depositing a metal film on the substrate to a sufficient thickness to bridge the aperture, wherein the metal is copper or aluminum and is deposited by electrochemical deposition; and
   b) annealing the substrate in a low pressure chamber at a temperature below a melting point of the metal film.

15. The method of claim 8, wherein the metal film is deposited and the substrate is annealed in the same chamber.

16. A method for filling a sub-half micron aperture on a substrate, comprising:
   a) chemical vapor depositing a metal film in the aperture on the substrate at a pressure of between about 1 Torr and about 80 Torr;
   b) annealing the substrate in a low pressure chamber at a pressure of not more than 1 Torr at a temperature below a melting point of the metal film; and
   c) physical vapor depositing a planarizing film over the metal film deposited on the substrate after the annealing of the substrate.

17. The method of claim 16, further comprising:
   d) depositing a conformal wetting film before the chemical vapor depositing of the metal film.

18. The method of claim 16, wherein the metal film is a metal selected from the group of aluminum, copper, and combinations thereof.

19. A method for filling a sub-half micron aperture on a substrate, comprising:
   a) depositing a metal film at a first pressure in the aperture on the substrate; and
   b) annealing the substrate at a second pressure less than the first pressure and at a temperature below a melting point of the deposited metal film.

20. The method of claim 19, wherein the metal film is deposited to a sufficient thickness to bridge the aperture.

21. The method of claim 19, wherein the metal film is deposited to an insufficient thickness to fill the aperture.

22. The method of claim 19, wherein the metal film is deposited by chemical vapor deposition.

23. The method of claim 19, wherein the metal film is deposited to a thickness between about 200 Å and about 2000 Å.

24. The method of claim 19, wherein the substrate is annealed at a temperature between about 300° C. and about 500° C.

25. The method of claim 19, wherein the substrate is annealed at a pressure less than 5 mTorr.

26. The method of claim 19, wherein the metal film is a metal selected from the group comprising aluminum, copper, and combinations thereof.

27. The method of claim 19, further comprising:
   c) physical vapor depositing a planarizing film over the annealed metal film.

28. The method of claim 19, wherein the metal film is deposited and the substrate is annealed in the same chamber.

* * * * *